United States Patent [19]
Beers et al.

[11] Patent Number: 5,932,078
[45] Date of Patent: Aug. 3, 1999

[54] CATHODIC ARC VAPOR DEPOSITION APPARATUS

[75] Inventors: Russell A. Beers, Palm Beach Gardens; Robert E. Hendricks, Port Saint Lucie, both of Fla.; Dean N. Marszal, Southington, Conn.; Allan A. Noetzel, Singer Island, Fla.; Robert J. Wright, Charlestown, W. Va.; Tyrus E. Royal, Lake Park, Fla.

[73] Assignee: United Technologies Corporation, Hartford, Conn.

[21] Appl. No.: 08/919,129

[22] Filed: Aug. 30, 1997

[51] Int. Cl.⁶ .................................................. C23C 14/32
[52] U.S. Cl. ................................ 204/298.41; 204/192.38
[58] Field of Search ...................... 204/298.41, 192.38; 118/723 VE

[56] References Cited

U.S. PATENT DOCUMENTS

| | | | |
|---|---|---|---|
| 3,625,848 | 12/1971 | Snaper | 204/192 |
| 3,783,231 | 1/1974 | Sablev et al. | 219/123 |
| 3,793,179 | 2/1974 | Sablev et al. | 204/298 |
| 3,836,451 | 9/1974 | Snaper | 204/298 |
| 4,151,059 | 4/1979 | Kuehnle | 204/298.27 |
| 4,492,845 | 1/1985 | Kljuchko et al. | 219/121 P |
| 4,609,564 | 9/1986 | Pinkhasov | 427/37 |
| 4,673,477 | 6/1987 | Ramalingam et al. | 204/192.38 |
| 4,724,058 | 2/1988 | Morrison, Jr. | 204/192.38 |
| 4,849,088 | 7/1989 | Veltrop et al. | 204/298 |
| 4,859,489 | 8/1989 | Pinkhasov | 427/37 |
| 4,869,203 | 9/1989 | Pinkhasov | 118/723 |
| 4,924,135 | 5/1990 | Pinkahsov | 313/326 |
| 4,929,321 | 5/1990 | Buhl | 204/192.38 |
| 4,942,844 | 7/1990 | Pinkhasov | 118/723 |
| 4,978,556 | 12/1990 | Pinkahsov | 427/37 |
| 5,011,638 | 4/1991 | Pinkhasov | 264/59 |
| 5,037,522 | 8/1991 | Vergason | 204/298.41 |
| 5,045,344 | 9/1991 | Pinkhasov | 427/37 |
| 5,126,030 | 6/1992 | Tamagaki et al. | 204/192.38 |
| 5,221,349 | 6/1993 | Tamagaki | 118/708 |
| 5,234,561 | 8/1993 | Randhawa et al. | 204/192.38 |
| 5,269,896 | 12/1993 | Munemasa et al. | 204/192.38 |
| 5,269,898 | 12/1993 | Welty | 204/298.41 |

(List continued on next page.)

FOREIGN PATENT DOCUMENTS 6-240444  8/1984  Japan ................................ 204/298.41

OTHER PUBLICATIONS

Randhawa, H. and Johnson, P. C. "Technical Note: A Review of Cathodic Arc Plasma Deposition Processes and Their Applications." *Surface and Coatings Technology,* 31 (1987), pp. 303–318. Elsevier Sequoia.

U.S. application No. 08/919,131 filed Aug. 30, 1997, Cathodic Arc Vapor Deposition Apparatus (Annular Cathode), Robert E. Hendricks et al.

U.S. application No. 08/919,130 filed Aug. 30, 1997, Vapor Deposition Production Coating System, Dean N. Marszal et al.

U.S. application No. 08/919,132 file Aug. 30, 1997, Apparatus for Steering the Arc in a Cathodic Arc Coater, Russel A. Beers et al.

U.S. application No. 08/919,133 filed Aug. 30, 1997, Apparatus for Driving the Arc in a Cathodic Arc Coater, Subbiah Ramalingam.

*Primary Examiner*—Nam Nguyen
*Assistant Examiner*—Rodney G. McDonald
*Attorney, Agent, or Firm*—Richard D. Getz

[57] ABSTRACT

An apparatus for applying material by cathodic arc deposition to a substrate is provided which includes a vessel, means for maintaining a vacuum in the vessel, a cathode, a contactor, means for selectively sustaining an arc of electrical energy between the cathode and an anode, and an actuator. The cathode and contactor are positioned inside the vessel, and the contactor is electrically connected to the means for selectively sustaining an arc of electrical energy. The actuator selectively actuates the contactor into electrical contact with the cathode, and thereby electrically connects the cathode to the means for sustaining an arc of electrical energy.

6 Claims, 3 Drawing Sheets

U.S. PATENT DOCUMENTS

| | | | |
|---|---|---|---|
| 5,279,723 | 1/1994 | Falabella et al. | 204/192.38 |
| 5,282,944 | 2/1994 | Sanders et al. | 204/192.38 |
| 5,306,408 | 4/1994 | Treglio | 204/192.38 |
| 5,317,235 | 5/1994 | Treglio | 315/111.41 |
| 5,363,400 | 11/1994 | Damond et al. | 204/298.41 |
| 5,380,420 | 1/1995 | Tsuji | 204/192.38 |
| 5,441,624 | 8/1995 | Chan et al. | 204/298.41 |
| 5,458,754 | 10/1995 | Sathrum et al. | 204/192.38 |
| 5,468,363 | 11/1995 | Falabella | 204/298.41 |
| 5,480,527 | 1/1996 | Welty | 204/192.38 |
| 5,518,597 | 5/1996 | Storer et al. | 204/192.38 |
| 5,580,669 | 12/1996 | Beers et al. | 428/660 |
| 5,588,975 | 12/1996 | Hammond et al. | 51/293 |

100000000
CATHODIC ARC VAPOR DEPOSITION APPARATUS

BACKGROUND OF THE INVENTION

1. Technical Field

This invention relates to vapor deposition apparatus in general, and to cathodic arc vapor deposition apparatus in particular.

2. Background Information

Vapor deposition as a means for applying a coating to a substrate is a known art that includes processes such as chemical vapor deposition, physical vapor deposition, and cathodic arc vapor deposition. Chemical vapor deposition involves introducing reactive gaseous elements into a deposition chamber containing one or more substrates to be coated. Physical vapor deposition involves providing a source material and a substrate to be coated in a evacuated deposition chamber. The source material is converted into vapor by an energy input, such as heating by resistive, inductive, or electron beam means.

Cathodic arc vapor deposition involves a source material and a substrate to be coated placed in an evacuated deposition chamber. The chamber contains only a relatively small amount of gas. The negative lead of a direct current (DC) power supply is attached to the source material (hereinafter referred to as the "cathode") and the positive lead is attached to an anodic member. In many cases, the positive lead is attached to the deposition chamber, thereby making the chamber the anode. An arc-initiating trigger, at or near the same potential as the anode, contacts and moves away from the cathode. When the trigger is in close proximity to the cathode, the difference in potential between the trigger and the cathode causes an arc of electricity to extend therebetween. As the trigger moves further away, the arc jumps between the cathode and the anodic chamber. The exact point, or points, where an arc touches the surface of the cathode is referred to as a cathode spot. Absent a steering mechanism, a cathode spot will move randomly about the surface of the cathode.

The energy deposited by the arc at a cathode spot is intense; on the order of $10^5$ to $10^7$ amperes per square centimeter with a duration of a few to several microseconds. The intensity of the energy raises the local temperature of the cathode spot to approximately equal that of the boiling point of the cathode material (at the evacuated chamber pressure). As a result, cathode material at the cathode spot vaporizes into a plasma containing atoms, molecules, ions, electrons, and particles. Positively charged ions liberated from the cathode are attracted toward any object within the deposition chamber having a negative electric potential relative to the positively charged ion. Some deposition processes maintain the substrate to be coated at the same electric potential as the anode. Other processes use a biasing source to lower the potential of the substrate and thereby make the substrate relatively more attractive to the positively charged ions. In either case, the substrate becomes coated with the vaporized material liberated from the cathode. The rate of deposition, the coating density, and thickness can be adjusted to satisfy the needs of the application.

Presently available cathodic arc coaters typically use a cooled cathode fixed in place within the coater. One cooling scheme provides a manifold attached to the cathode that permits the passage of coolant between the cathode and manifold. Another scheme uses coolant piping connected to a hollow cathode. A problem with either scheme is that the cathode must be machined to accept the manifold or piping. Not all cathode materials are amenable to machining and even where possible, machining adds significantly to the cost of the consumable cathode. Another problem with directly cooling the cathode is the labor required to replace the cathode when its useful life has expired. In the previous example where a manifold (or piping) is mechanically attached to the cathode, the manifold (or piping) must be detached from the old cathode and attached to a new one, and the deposition chamber subsequently cleaned of coolant. For those applications which require cathode replacement after each coating run, the labor costs and down time can be considerable. Still another problem with direct cathode cooling is leakage. Coolant leakage occurring during deposition can contaminate the substrates being coated and require extensive cleaning within the deposition chamber. Airfoils for gas turbine engines are an example of an expensive substrate to be coated; one where it would be a distinct advantage to minimize or eliminate losses due to contamination.

In short, what is needed is an apparatus for cathodic arc vapor deposition of material on a substrate that operates efficiently, one capable of repeatably providing a high quality coatings on a substrate, and one that operates cost effectively.

DISCLOSURE OF THE INVENTION

It is, therefore, an object of the present invention to provide an apparatus for cathodic arc vapor deposition of material on a substrate that operates in an efficient, cost effective manner.

It is another object of the present invention to provide an apparatus for cathodic arc vapor deposition of material on a substrate that repeatably provides a high quality coating on a substrate.

According to the present invention, an apparatus for applying material by cathodic arc vapor deposition to a substrate is provided which includes a vessel, means for maintaining a vacuum in the vessel, a cathode, a contactor, means for selectively sustaining an arc of electrical energy between the cathode and an anode, and an actuator. The cathode and contactor are positioned inside the vessel, and the contactor is electrically connected to the means for selectively sustaining an arc of electrical energy. The actuator selectively actuates the contactor into electrical contact with the cathode, and thereby electrically connects the cathode to the means for sustaining an arc of electrical energy. The arc of electrical energy extending between the cathode and the anode liberates cathode material, which is subsequently deposited on the substrate located inside the vessel.

An advantage of the present invention is that the present invention apparatus for cathodic arc vapor deposition of material on a substrate is designed to operate in a cost effective manner. One cost effective characteristic of the present invention is the cathode. The present invention cathode is preferably disk-shaped and can be cut, for example, from a cylindrical casting. The simply formed cathode requires minimal expensive machining, thereby reducing the cost of the cathode and the overall coating process. Another cost effective characteristic is that the cathode is indirectly cooled. Presently available cathodic arc coaters that pass coolant in direct contact with the cathode (i.e., direct cooling) generally require machining to accept a manifold or piping. The machining significantly increases the cost of the consumable cathode. Another cost effective characteristic is that the cathode is readily inserted in the vessel. Some prior art cathodic arc coaters have cathodes that are fastened in place with the deposition chamber, and/or have attached cooling apparatus. In either case, the labor to install and remove the cathode undesirably increases the cost of the coating process. Another cost effective characteristic of the present invention is that the form of the used cathode facilitates recycling. The used cathode is made of high quality material that has been exposed to few, if any, contaminants. Consequently, the cathodes have considerable scrap value that reduces the cost of the coating process.

Another advantage of the present invention is that high quality coatings can be consistently produced. The platter provides for rotation of the substrates to promote uniform deposition, and the indirect cooling of the cathode via the contactor minimizes the chance of coolant contamination. Hence, high quality coatings can be consistently deposited on substrates.

These and other objects, features and advantages of the present invention will become apparent in light of the detailed description of the best mode embodiment thereof, as illustrated in the accompanying drawings.

BEST MODE FOR CARRYING OUT THE INVENTION

I. Apparatus

Figure 1:
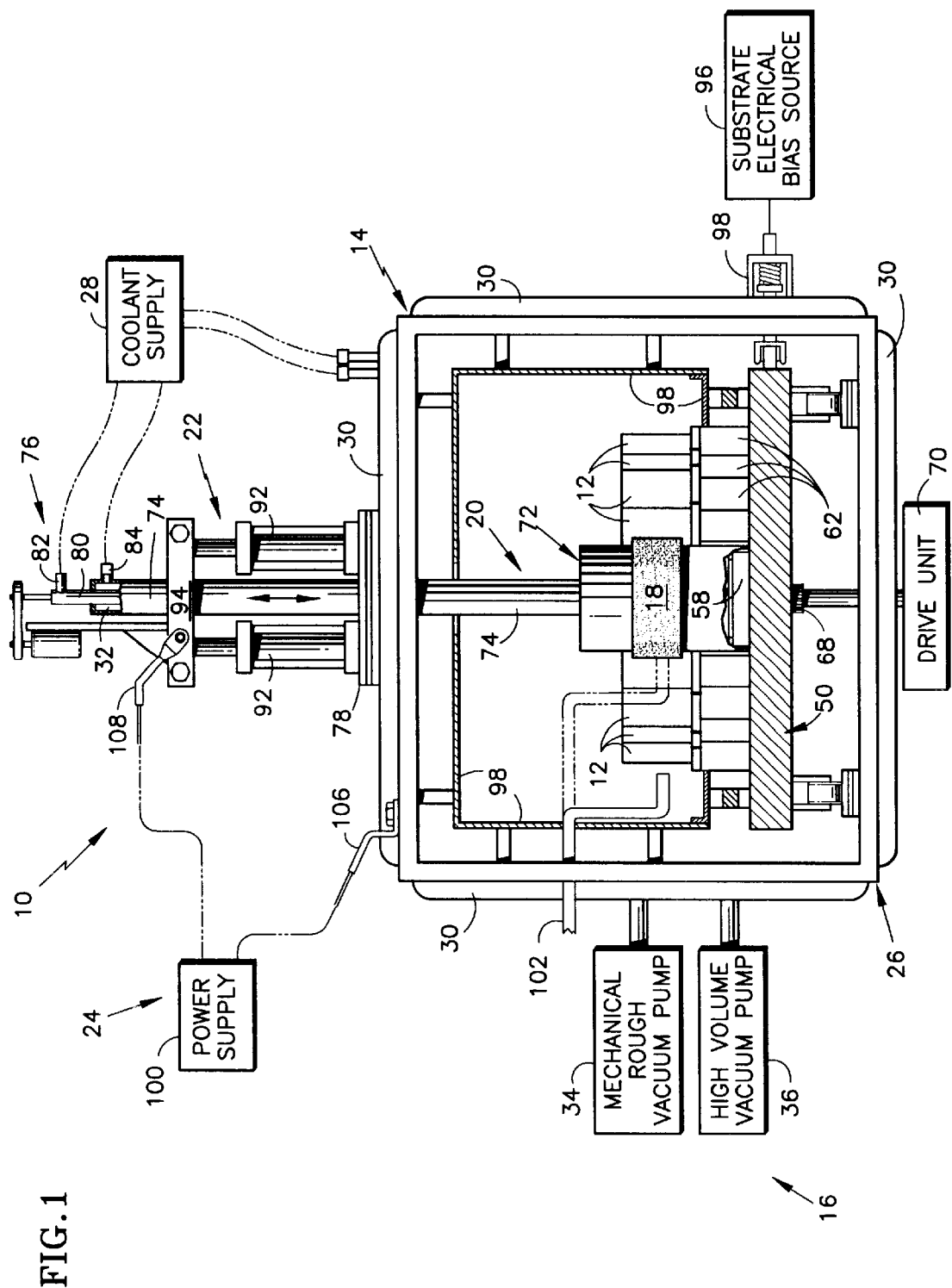
FIG. 1 is a diagrammatic view of the present invention cathodic arc vapor deposition apparatus.

Referring to FIG. 1, an apparatus 10 for cathodic arc vapor deposition on a substrate 12, hereinafter referred to as a "cathodic arc coater", is provided having a vessel 14, means 16 for maintaining a vacuum in the vessel 14, a cathode 18, a contactor 20, an actuator 22 for selectively actuating the contactor 20 into electrical contact with the cathode 18, and means 24 for sustaining an arc of electrical energy between the cathode 18 and an anode 26. A coolant supply 28 maintains the coater 10 within acceptable temperatures by cycling coolant through passages 30,32 within the vessel 14 and contactor 20, respectively. In the preferred embodiment, the means 16 for maintaining a vacuum in the vessel 14 includes a mechanical rough vacuum pump 34 and a high-volume diffusion-type vacuum pump 36 piped to the interior of the vessel 14. Other vacuum means may be used alternatively.

Figure 2:
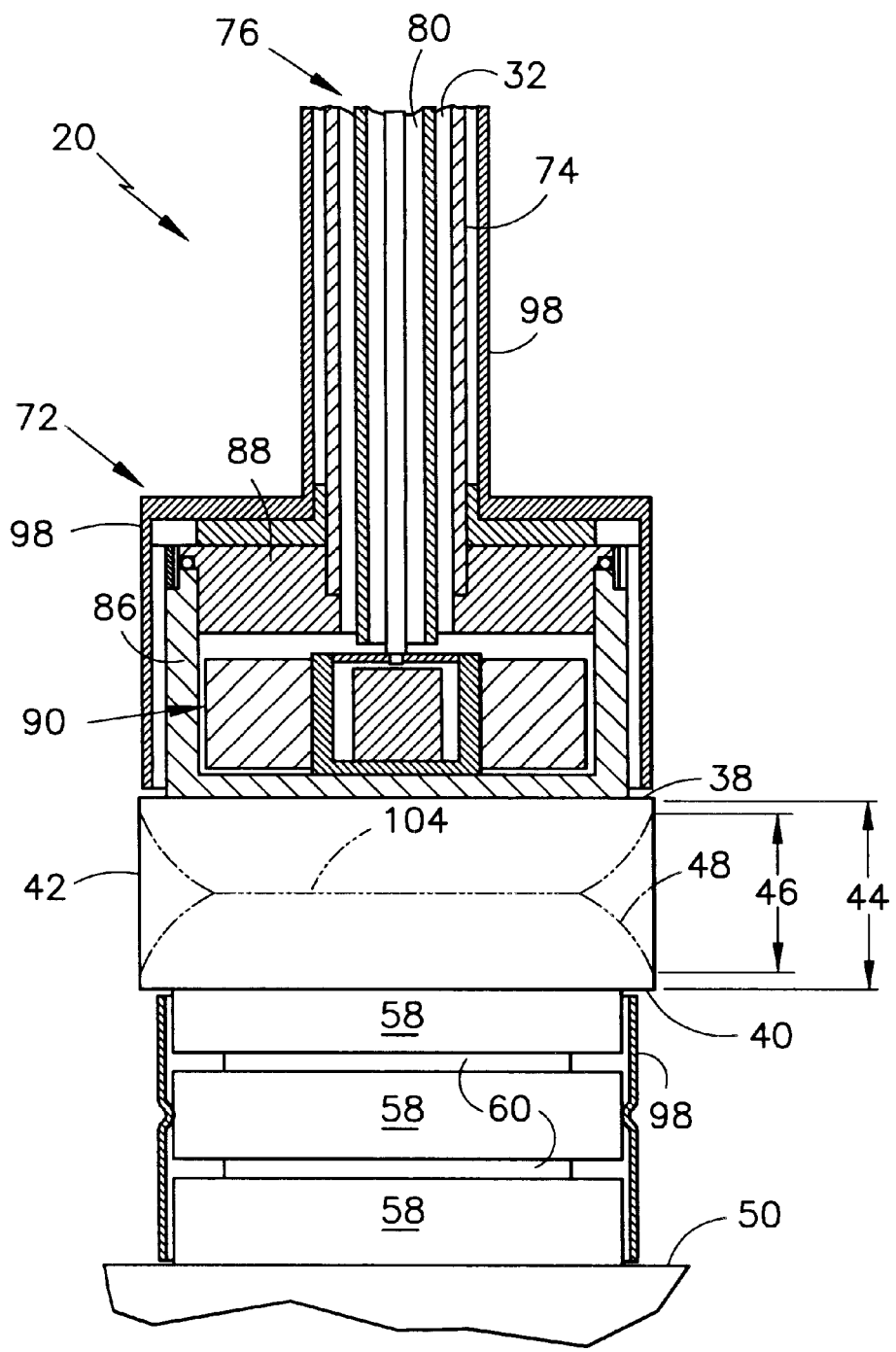
FIG. 2 is a top diagrammatic view of the present invention platter.

Referring to FIG. 2, the cathode 18 is a substantially cylindrical disk having a first end surface 38, a second end surface 40, and an evaporative surface 42 extending therebetween. The end surfaces 38,40 are substantially parallel with one another. The material composition of the cathode 18 will depend upon the material to be deposited, and in most cases the cathode 18 can be cut from a cast rod. The axial length 44 of the evaporative surface 42 is preferably longer than the anticipated final axial length 46 of the erosion pattern 48 along the evaporative surface 42. Keeping the erosion pattern 48 between the end surfaces 38,40 minimizes the possibility that the arc will leave the evaporative surface 42 of the cathode 18.

Figure 3:
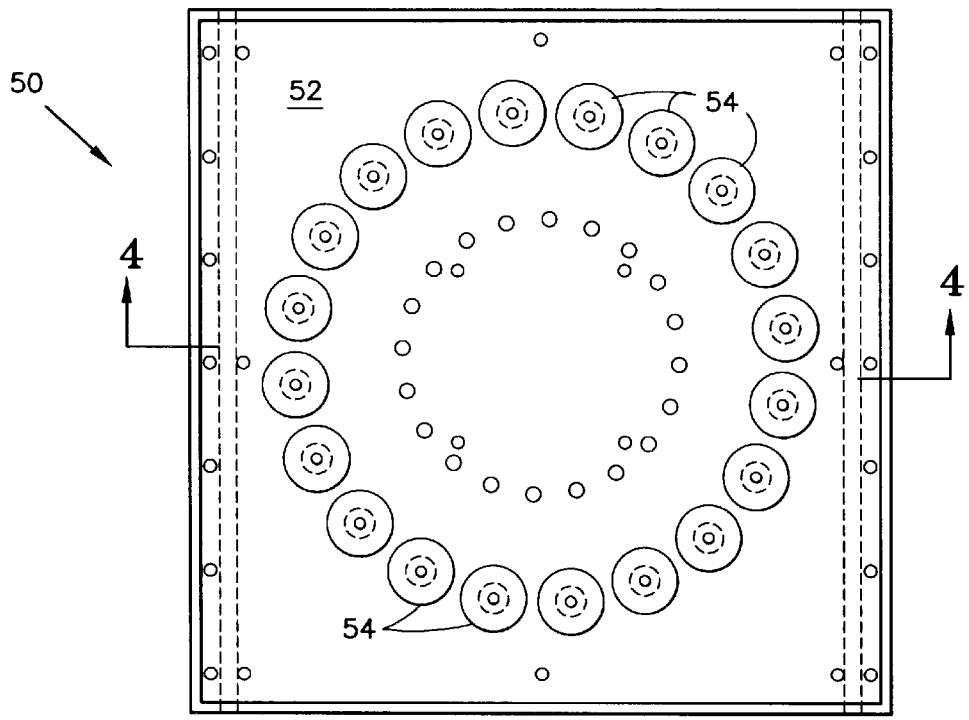
FIG. 3 is a side view of the platter shown in FIG. 2.
Figure 4:
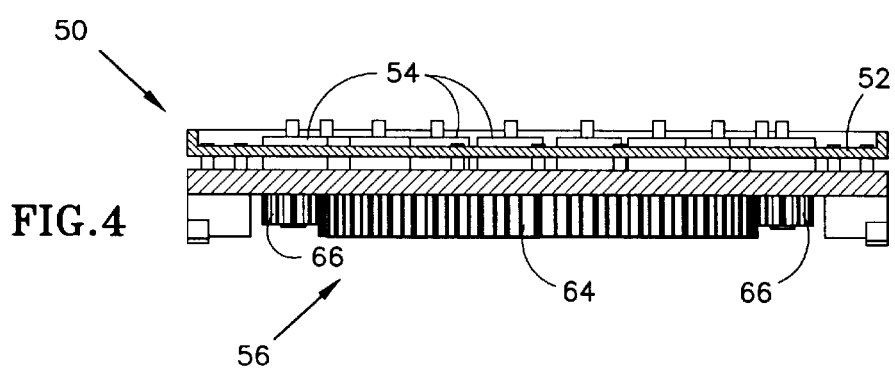
FIG. 4 is a diagrammatic cross-sectional view of a contactor.

Referring to FIGS. 1, 3 and 4, in the preferred embodiment the cathode 18 is positioned on a removable platter 50. The platter 50 includes a tray 52, a plurality of pedestals 54, and means 56 for rotating the pedestals 54. The cathode 18 is mounted in the center of the platter 50, on top of a plurality of spacers 58 (see also FIG.2) separated by electrical insulators 60. Adapters 62 attached to the pedestals 54 can be used to align the substrates 12 radially outside the cathode 18.

The means 56 for rotating the pedestals 54 includes a center gear 64 engaged with a plurality of pedestal gears 66. Each pedestal gear 66 is fixed to a pedestal 54, and the center and pedestal gears 64,66 are pivotly attached to the tray 52. The center gear 64 is driven by a gear 68 positioned inside the vessel 14. A shaft extending through the vessel wall connects the gear 68 to a drive unit 70.

Referring to FIGS. 1 and 2, the contactor 20 includes a head 72 attached to a shaft 74, and means 76 for cooling the contactor 20. The head 72 is positioned inside the vessel 14 and the shaft 74 extends from the head 72 to outside the vessel 14. An insulative disk 78 (FIG. 1) electrically insulates the contactor 20 from the vessel 14. The means 76 for cooling the contactor 20 includes a cooling tube 80 coaxially positioned within the shaft 74, a coolant inlet port 82 connected to the cooling tube 80, and a coolant exit port 84 connected to the passage 32 formed between the coaxial coolant tube 80 and shaft 74. The coaxial arrangement between the cooling tube 80 and the shaft 74 allows coolant to flow in the cooling tube 80 and exit via the passage 32 between the shaft 74 and the cooling tube 80, or vice versa. The head 72 includes a cup 86 and a shaft flange 88. The shaft flange 88 is fixed to the shaft 74 and the cup 86 is fixed to the shaft flange 88. The cup 86, shaft flange 88, and shaft 74 are fabricated from an electrically conductive material such as a copper alloy. The preferred embodiment of the head 72 further includes a magnetic field generator 90.

Referring to FIG. 1, the actuator 22 for selectively actuating the contactor 20 into electrical contact with the cathode 18 includes a pair of two-way actuating cylinders 92 (hydraulic or pneumatic) for acting between the vessel 14 and a shaft flange 94 attached to the contactor shaft 74. Mechanical apparatus (not shown) may be used in place of the actuating cylinders 92. A commercially available controller can be used to control the position and force of the cylinders (or mechanical apparatus).

In the preferred embodiment, the cathodic arc coater 10 includes a biasing source 96 for electrically biasing the substrates 12. A contact-type switch 98 electrically connects the biasing source 96 and the platter 50. The substrates 12, which are mechanically and electrically attached to the platter 50, are consequently electrically connected to the biasing source 96. Other means for electrically connecting the substrates 12 to the biasing source 96 may be used alternatively.

Deflector shields 98 are used throughout the cathodic arc coater 10 to confine the vaporized cathode materials in the area of the substrates 12. The shields 98 attached to the vessel 14, platter 50, spacers 58, and contactor 20 help minimize undesirable material build-up on those surfaces. In the preferred embodiment, the deflector shields 98 attached to the vessel 14 are electrically connected to the vessel 14 and are made of an electrically conductive material such as stainless steel.

The means 24 for sustaining an arc of electrical energy between the cathode 18 and an anode 26 includes a direct current (D.C.) power supply 100. In the preferred embodiment, the positive lead 106 of the power supply 100 is connected to the vessel 14, thereby making the vessel 14 act as an anode. The negative lead 108 of the power supply 100 is electrically connected to the contactor 20. Alternative embodiments may use an anode (not shown) disposed inside the vessel 14. An arc initiator 102, at or near the electrical potential of the vessel 14, is used to initiate the arc.

II. Operation of the Apparatus

Referring to FIG. 1, in the operation of the present invention cathodic arc coater 10, a plurality of substrates 12 and a cathode 18 are attached to a platter 50 and the platter 50 is loaded into the vessel 14. During loading, the platter center gear 64 engages the gear 68 disposed within the vessel 14 and the biasing source 96 electrically connects with the platter 50. At this point the substrates 12 have been degreased and substantially cleaned, although each will likely have some molecular contaminant and oxidation remaining on its exterior surface. The actuating cylinders 92 subsequently actuate the contactor 20 into electrical contact with the cathode 18 and the vessel 14 is closed.

The mechanical rough vacuum pump 34 is operated to evacuate the vessel 14 to a predetermined pressure. Once that pressure is reached, the high-volume diffusion vacuum pump 36 further evacuates the vessel 14 to near vacuum conditions. The substrates 12 are then cleaned of any remaining contaminants and/or oxidation by a method such as "sputter cleaning". Sputter cleaning is a process well known in the art and will not be described in detail here. Other cleaning methods may be used alternatively. After the substrates 12 are cleaned, the contaminants are purged typically using an inert gas.

Prior to initiating an arc several steps are completed, including: (1) the substrates 12 are set to a particular bias via the biasing source 96, making them electrically attractive to positive ions emitted from the cathode 18; (2) the substrates 12 are placed in motion at a particular rotational speed; (3) the power supply 100 is set to establish an arc having a particular magnitude of current and voltage, but no arc is initiated; (4) the vacuum pumps 34,36 establish and maintain a particular vacuum pressure of gas within the vessel 14; and (5) coolant flows are established through the cooling passages 30 attached to the vessel 14 and through the cooling passages 32 within the contactor 20. Specific process parameters will depend upon factors such as the substrate material, the material to be coated, and the desired characteristics of the coating, etc.

Once the aforementioned steps have been completed, the arc initiator 102 is brought into and out of contact with the evaporative surface 42 of the cathode 18, causing an arc to jump between the arc initiator 102 and the evaporative surface 42. The arc initiator 102 is subsequently moved a distance away from the cathode 18, preferably radially outside of the substrates 12. Once the arc initiator 102 is no longer proximate the cathode 18, the arc jumps between the cathode 18 and the deflector shields 98 electrically connected to the vessel 14 (or the vessel 14 if there are no deflector shields 98). The magnetic field generator 90 positioned in the contactor 20 produces a magnetic field that runs parallel to the evaporative surface 42 of the cathode 18 which drives the arc along an arc path 104 around the evaporative surface 42 of the cathode 18.

The energy delivered by the arc causes the material at the cathode spot to vaporize, thereby liberating atoms, molecules, ions, electrons, and particles from the cathode 18. FIG. 2 shows an eroded cathode 18 in phantom. The erosion is substantially symmetrical relative to the arc path 104. The biased substrates 12 attract the ions, causing them to accelerate toward the substrates 12. The ions strike the exterior surface of the substrates 12, attach and collectively form a coating of the cathode material. The rotation of the substrates 12 relative to the cathode 18 promotes uniform deposition of the coating on the substrate 12. Coolant passes through and directly cools the contactor 20, and indirectly cools the cathode 18.

When a coating of sufficient thickness has been deposited on the substrates 12, the power supply 100 is turned off and the arc extinguished. The vessel 14 is purged with inert gas and brought to ambient pressure. The contactor 20 is actuated out of contact with the cathode 18 and the platter 50 is removed from the vessel 14. The substrates 12 (and cathode 18 if necessary) are subsequently removed and new substrates 12 (and cathode 18) attached. The loaded platter 50 is then inserted back into the vessel 14 in the manner described earlier and the process repeated.

Although this invention has been shown and described with respect to the detailed embodiments thereof, it will be understood by those skilled in the art that various changes in form and detail thereof may be made without departing from the spirit and the scope of the invention. For example, the means 76 for cooling the contactor 20 is described as having a cooling tube 80 coaxially positioned within the contactor shaft 74. Alternative means of delivering coolant to the head 72 of the contactor 20 may be used. Another alternative embodiment of the present invention includes a second contactor (not shown) that actuates up through the platter 50. The second contactor may also include means for cooling, for improved cooling of the cathode.

We claim:

1. An apparatus for applying material by cathodic arc vapor deposition to a plurality of substrates, comprising:

a vessel;

means for maintaining a vacuum in said vessel;

a disk-shaped cathode positioned inside said vessel, said cathode having a first end surface, a second end surface, and an evaporative surface extending between said end surfaces;

means for selectively sustaining an arc of electrical energy between said cathode and an anode; and a selectively actuable contactor positioned inside said vessel, said contactor including cooling means, wherein said contactor is selectively actuated into contact with one of said end surfaces of said cathode, thereby providing indirect cooling of said cathode, and wherein said contactor provides an electrical connection between said means for selectively sustaining an arc of electrical energy between said cathode and an anode, and said cathode;

wherein the substrates are disposed around said disk-shaped cathode, and said arc of electrical energy extending between said cathode evaporative surface and said anode liberates a portion of said cathode which is subsequently deposited on the substrates.

2. An apparatus according to claim 1, wherein said contactor comprises:

a head positioned inside said vessel; and a shaft having a bore, said shaft attached to said head, and said shaft extending from said head to outside said vessel.

3. An apparatus according to claim 2, wherein said cooling means comprises:

a cooling tube positioned inside said bore of said contactor shaft, wherein a passage is formed between said cooling tube and said shaft; and a coolant supply connected to said cooling tube and said passage, for providing a coolant within said contactor; wherein coolant from said coolant supply enters said contactor through one of said cooling tube or said passage and exits said contactor through the other of said cooling tube or said passage.

4. An apparatus according to claim 3, wherein said means for selectively sustaining an arc of electrical energy between said cathode and said anode comprises:
- a power supply, having a positive lead and a negative lead;
  - wherein said negative lead of said power supply is electrically connected to said contactor, and said positive lead is electrically connected to said vessel, thereby making said vessel, and any member electrically connected to said vessel, act as said anode; and
  - wherein said cathode is electrically insulated from said vessel.

5. An apparatus according to claim 4, further comprising:
- a platter, for holding the substrates and said cathode;
  - wherein said cathode is electrically insulated from said platter; and
  - wherein said platter may be selectively removed from said vessel.

6. An apparatus according to claim 5, further comprising:
- a biasing source, for electrically biasing the substrates;
- means for electrically connecting said biasing source to the substrates, wherein said means for electrically connecting said biasing source to the substrates electrically connects said biasing source to said platter, and said platter is electrically connected to the substrates.

* * * * *